United States Patent [19]
Sauer

[11] Patent Number: 5,731,743
[45] Date of Patent: Mar. 24, 1998

[54] FREQUENCY SYNTHESIZER HAVING PHASE ERROR FEEDBACK FOR WAVEFORM SELECTION

[75] Inventor: Donald Jon Sauer, Allentown, N.J.

[73] Assignee: David Sarnoff Research Center, Inc., Princeton, N.J.

[21] Appl. No.: 726,415

[22] Filed: Oct. 7, 1996

[51] Int. Cl.$^6$ ............... H03B 5/24; H03B 19/00; H03B 28/00
[52] U.S. Cl. ............... 331/57; 331/25; 331/74
[58] Field of Search ............... 331/25, 34, 45, 331/57, 60, 74, 179; 327/105, 156–159; 375/326

[56] References Cited

U.S. PATENT DOCUMENTS 5,233,316  8/1993  Yamada et al. ............... 331/45
5,448,191  9/1995  Meyer ............... 331/45 X
5,561,398  10/1996  Rasmussen ............... 331/57 X

*Primary Examiner*—David Mis
*Attorney, Agent, or Firm*—William J. Burke; John V. Silverio

[57] ABSTRACT

A frequency synthesizer including a fixed frequency oscillator providing a plurality of waveforms having a first frequency, each waveform being delayed in time with respect to another of the waveforms, and a waveform selector, the waveform selector operable to continuously select as an output waveform a waveform from the plurality of waveforms. In an embodiment, the selection of the waveform is made to provide an output waveform having low jitter with respect to an ideal waveform.

16 Claims, 3 Drawing Sheets

5,731,743

FREQUENCY SYNTHESIZER HAVING PHASE ERROR FEEDBACK FOR WAVEFORM SELECTION

BACKGROUND OF THE INVENTION

1. Field of the Invention

This invention relates to the field of waveform synthesis and more particularly to the synthesis of a low-jitter waveform.

2. Description of the Related Art

Modern transmitters typically require operation over a range of frequencies. Moreover, discrete digital circuits within a single electronic component can require input clock signals at unique frequencies. In each case, a plurality of crystal oscillators can be provided to supply waveforms at the various frequencies required. Such a solution is obviously impractical and inefficient. More likely, a waveform having a single, fixed frequency provided by a single crystal oscillator is electronically multiplied and/or divided as necessary to produce one or more output waveforms having the desired frequencies. A phase-locked loop (PLL) can be used to synchronize the phase and frequency of an output waveform with that of the fixed-frequency oscillator waveform.

SUMMARY OF THE INVENTION

A frequency synthesizer including a fixed frequency oscillator providing a plurality of waveforms having a first frequency, each waveform being delayed in time with respect to another of the waveforms, and a waveform selector, the waveform selector operable to continuously select as an output waveform a waveform from the plurality of waveforms.

BRIEF DESCRIPTION OF THE DRAWING

The following detailed description will be more fully understood with reference to the accompanying drawing in which.

DETAILED DESCRIPTION

Figure 1:
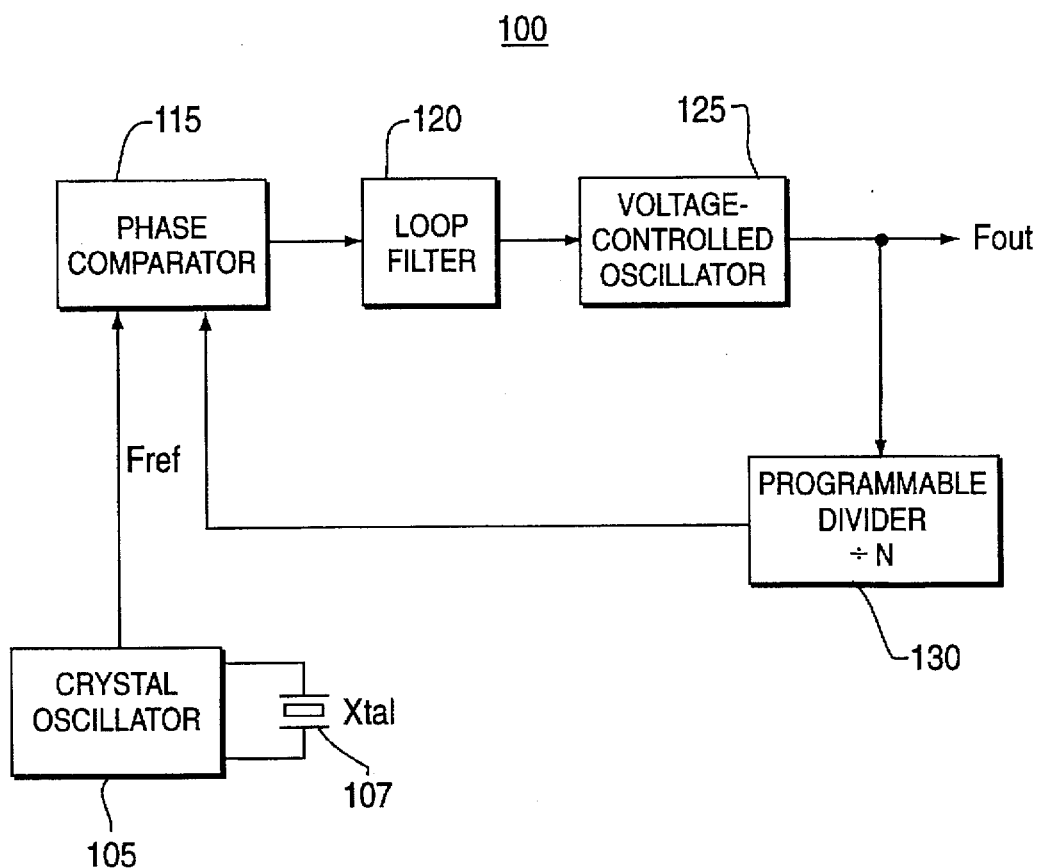
FIG. 1 is a block diagram of a frequency synthesizer of the prior art.

FIG. 1 shows a block diagram of a PLL frequency synthesizer 100 of the prior art. Frequency synthesizer 100 includes crystal oscillator 105 having crystal 107 for generating a waveform having a fixed frequency (Fret). The waveform from crystal oscillator 105 is applied to one input of phase comparator 115. The output from programmable divide by N divider 130 is applied to the another input of phase comparator 115. Under conditions of lock, the two inputs to phase comparator 115 have a constant phase relationship and must, therefore, have the same frequency. The output frequency Pout is determined by N*Fref. For example, if the value of N decreases, the frequency out of divider 130 will exceed Fref, the phase difference will drop and output from phase comparator 115 will decrease. The tuning voltage to voltage-controlled oscillator (VCO) 125 will decrease as a result and the output frequency will decrease. The opposite is true should the value of N increase. Loop filter 120 is present to suppress undesired components produced in the phase detector so that they do not produce unwanted noise components on VCO 125.

Additional components may be added to PLL frequency synthesizer 100 to allow a greater resolution in the frequencies to be synthesized. For example a divide by M divider can be interposed between clock oscillator 105 and phase comparator 115, in which case Fout is determined by (N*Fref)/M.

Jitter, the time variation in the period of a clock, is a concern whenever one or more output clocks are derived from a system clock. For example, assume that a maximum Root Mean Square (RMS) jitter of 100 picoseconds (ps) is required from the output of the phase-locked loop frequency synthesizer shown in FIG. 1. The highest common integer frequency which can be input to phase comparator 115 is 11 KHz, resulting in a very high loop gain for d$\phi$/dV. The extremely high stability required of VCO 125 to attain the high gain is not readily achievable when using an integrated circuit (IC) frequency synthesizer with an included on-chip VCO. For example, since the phase detector is sampling the VCO phase error only once every 91 $\mu$s (1/11 KHz), an open-loop VCO stability of 1.1 parts per million is required to limit jitter to 100 ps. Such a low level of stability is not realistically achievable by an on-chip VCO.

The invention is a frequency synthesizer which provides an output clock waveform having low jitter. The output clock waveform is derived from an oscillator locked to a reference input clock using a conventional PLL circuit. In an embodiment, a multi-stage differential ring VCO with a fixed and known delay per stage is phase locked to the reference frequency of a system clock or some multiple or divisor of the frequency of the system clock using PLL circuitry. A typical waveform from the ring oscillator has a frequency identified as Fosc. The time delay between the stages in the ring oscillator is fixed and is defined by Tdl=(1/Fosc)/(# of stages*2). As described further below, the invention can determine a closest edge from multiple waveforms being output by the ring oscillator, such that the maximum phase jitter of the synthesized output clock (Fmx) of the invention is Tdl/2. Assuming uniform phase distribution and excluding random noise, the RMS phase jitter is Tdl/2*$\sqrt{3}$.

Figure 2:
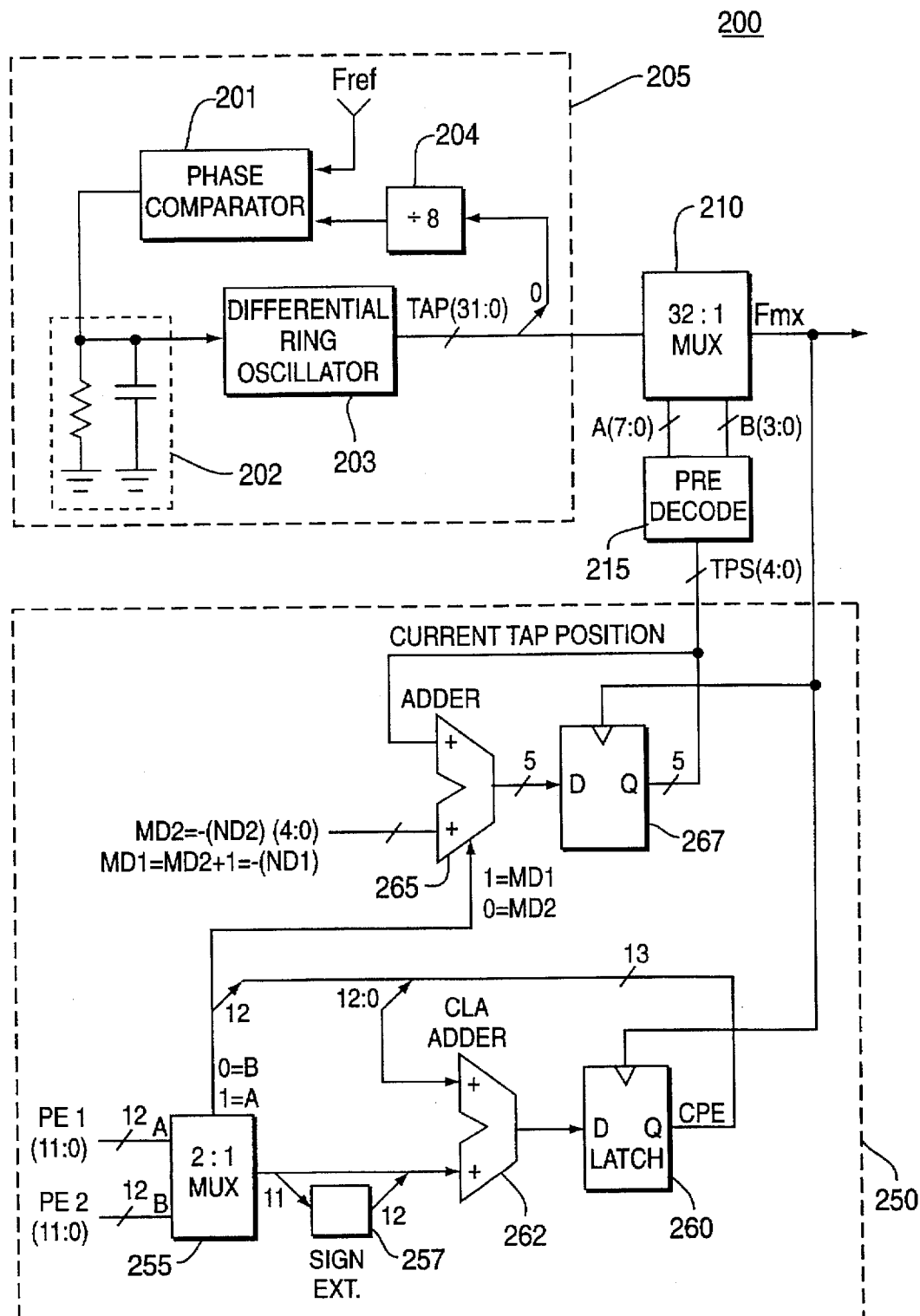
FIG. 2 is a block diagram of an embodiment of a frequency synthesizer of the invention.

FIG. 2 is a block diagram of frequency synthesizer 200 of the invention. Frequency synthesizer 200 has PLL 205, including phase comparator 201 into which is input the system reference clock (Fref). In the embodiment shown, PLL 205 includes a sixteen (16) stage differential ring oscillator 203 having a nominal oscillating frequency ($F_{osc}$). Sixteen-stage ring oscillator 203 has 32 taps, a true and a complement tap from each stage, each outputting a waveform at Fosc. Starting with Tap (0), the rising edge of the waveform from each subsequently numbered tap is delayed by Tdl with respect to the previous tap. Tdl therefore equals the time delay between Tap(n) and Tap(n+1). In the embodiment shown, the time delay (Tdl) between the rising edge output from adjacent taps of oscillator 203 is (1/Fosc)/number of taps=(1/Fosc)/32. The taps are numbered 0 to 31. In the embodiment shown, the output from tap 0 is fed back through divider 204. Divider 204 divides the frequency of the waveform from tap 0 of ring oscillator 203 by a divisor to enable ring oscillator 203 to operate at a frequency higher than Fref. The output of divider 204 is a waveform having a frequency equal to Fref. The output of divider 204 is fed to a second input of phase comparator 201.

Figure 3:
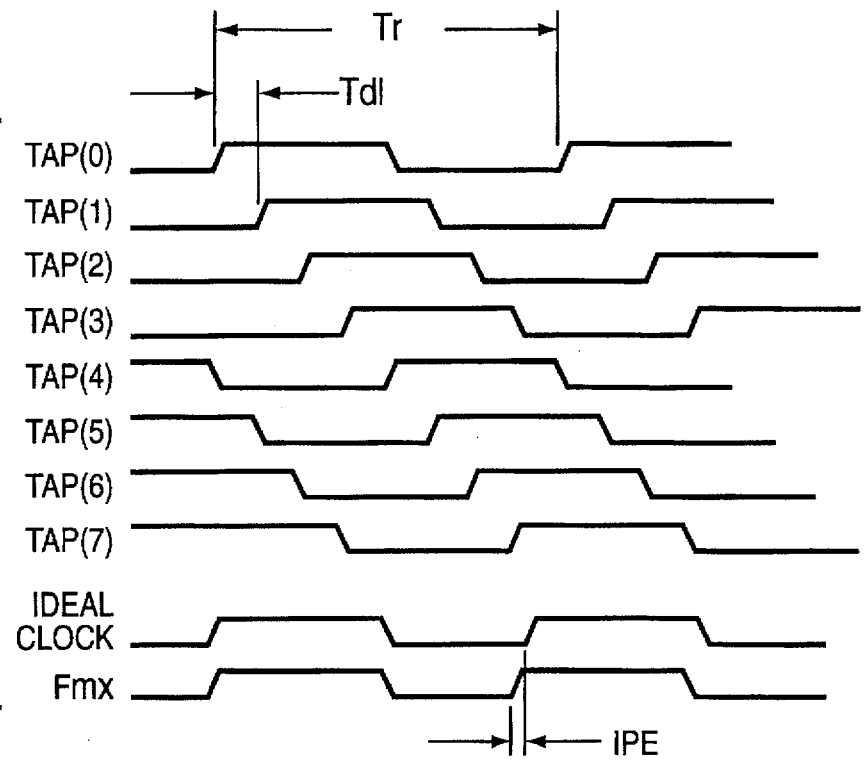
FIG. 3 is an exemplary timing diagram for a four stage ring oscillator.

For illustration purposes, a timing diagram for a four stage ring oscillator is shown in FIG. 3. As shown, Tdl is the time between rising edges of the waveforms from adjacent taps. The period of a waveform from any one tap (Tr) is a fixed and known value and is equal to 1/Fosc. It should be understood that the timing relationships shown for the 4 stage ring oscillator in FIG. 3 can be expanded for 16 stage ring oscillator 203.

The thirty-two taps from ring oscillator 203 are coupled to 32:1 multiplexer (MUX) 210. Multiplexing is controlled by clock selection logic 250 implementing an edge selection process.

Figure 4:
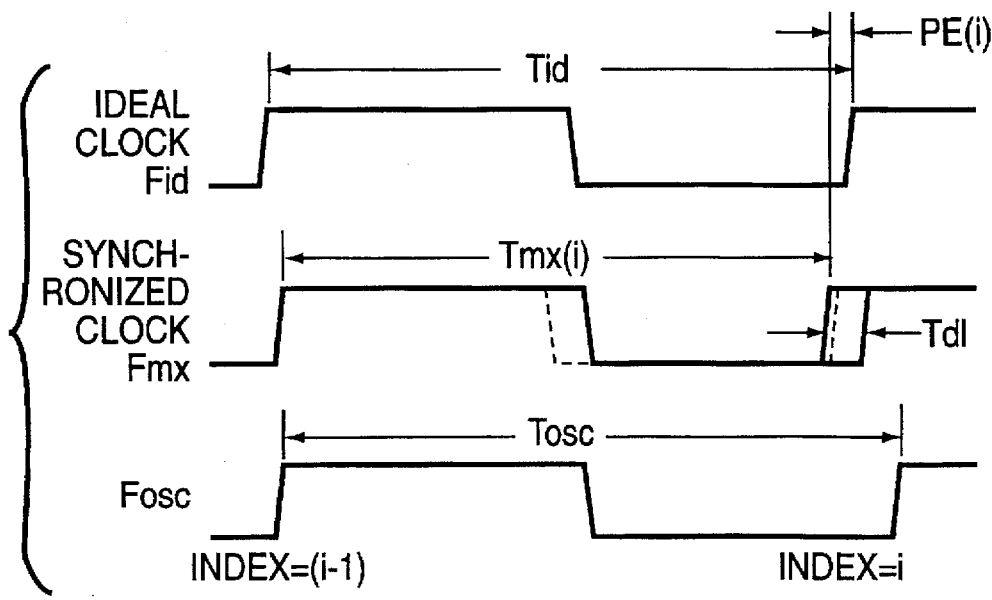
FIG. 4 is a detailed timing diagram which shows the relationship between the ring oscillator clock (Fosc), the ideal clock (Fid) and the synchronized clock (Fmx).

The invention, including the edge selection process, is further described with reference to the detailed timing diagram of FIG. 4, which shows the relationship between the waveforms of ring oscillator 203 (Fosc), the ideal clock (Fid) and the synchronized clock (Fmx). The ideal clock would provide an output waveform without jitter.

The Fmx clock index (i) is used to define and identify the sequence of positive clock edges which are generated by selecting different tap outputs from the ring oscillator. The width of the low portion of the Fmx clock waveform is fixed and is equal to 16*Tdl. The width of the high portion of the Fmx clock waveform varies on each cycle and is equal to the value (16-ND(i))*Tdl where ND(i) is the decrement applied to the tap position just after the positive clock edge at index=(i−1) to select the tap used for the positive clock edge at index=i. The instantaneous period Tmx(i) of Fmx at index=i is defined as the time difference between the rising edge of Fmx at index=i−1 and at index=i. The period Tmx(i) at index=i is (32-ND(i))*Tdl. The period of the ideal clock T(id) and of ring oscillator 203 (Tosc) are shown for reference.

At each clock index i an incremental phase error IPE(i) occurs between Fmx and Fid which has the value:

$$IPE(i)=Tdif-ND(i)*Tdl$$

where Tdif=Tosc−Tid, i.e., is the difference between the ring oscillator period and the ideal period of Fmx.

The choice for ND(i) can be constrained to only two values ND1 and ND2=ND1+1 which are chosen so that the incremental phase error is positive for ND(i)=ND1 and negative for ND(i)=ND2. Therefore the two values possible for the instantaneous period of clock Fmx bracket the ideal clock period. The edge selection process is designed to minimize the cumulative phase error (CPE) which is defined as:

$$CPE(i) = \sum_{j=1}^{i} IPE(j) = \sum_{j=1}^{i} \{(Tosc - Tid) - ND(j)*Tdl\}$$

The edge selection logic uses the sign of CPE(i) to determine the next clock tap decrement value so that if CPE(i) is negative, then ND(i+1)=ND1 resulting in a positive incremental phase error IPE1, and conversely if CPE(i) is positive, then ND(i+1)=ND2 resulting in a negative incremental phase error IPE2. IPE1 and IPE2 are given by:

$$IPE1=(Tosc-Tid)-ND1*Tdl$$

$$IPE2=(Tosc-Tid)-ND2*Tdl$$

The value of ND1 is determined as the integer part of (Tdif/Tdl). This results in an average phase error APE(i) of (IPE1+IPE2)/2 which represents a fixed phase offset between the ideal clock and Fmx. The average phase error is defined as:

$$APE(i) = \left\{ \sum_{k=1}^{i} CPE(k) \right\} /i = \left\{ \sum_{k=1}^{i} \sum_{j=1}^{k} IPE(j) \right\} /i$$

A table of the variables is set forth below in Table 1.

| i | Fmx Clock Edge Index |
|---|---|
| Tap(31:0) | 32 taps obtained form ring oscillator. Starting with Tap(0), each subsequent tap is delayed by Tdl with respect to the previous tap. |
| ND(i) | Decrement applied to tap position at index=i to select tap for index=i+1. |
| Tdl | Delay time between Tap(n) and Tap(n+1) |
| Tosc | Ring Oscillator Period, equal to period of waveform from each tap. |
| Tdif | Tosc–Tid. Difference between ring oscillator period and ideal multiplexed output period. |
| CPE | Cumulative Phase error - Integral of IPE |
| IPE | Incremental Phase Error |
| APE | Average Phase Error |

Referring again to FIG. 2, particularly edge selection logic 250 of FIG. 2, Incremental Phase Error 1 (IPE1) and Incremental Phase Error 2 (IPE2) are applied to 2:1 multiplexer (MUX) 255. IPE1 and IPE2 preferably are 12 bit numbers in two's complement format which include a sign bit. The output of MUX 255 is passed through sign extension 257 which changes the 12 bit binary value output by MUX 255 into a 13 bit binary number in two's complement format. Latch 260 is a 13 bit wide latch which stores the current value for the CPE, for example at index=i−1. The output of latch 260 is fed back to carry look-ahead adder 262 where it is added with either IPE1 or IPE2 to determine the next subsequent CPE, e.g., at index=i.

The most significant bit (MSB), of the 13 bit word output from latch 260 is used to control MUX 255. In the event the sign bit is (1), i.e., the CPE output from latch 260 is negative, MUX 255 switches IPE1 to adder 262. If the sign bit is (0), i.e., the CPE output from latch 260 is positive, MUX 255 switches IPE2 to adder 262. At the next clock cycle, adder 262 adds either IPE1 or IPE2 with the current CPE to generate an updated CPE.

The MSB of the value output by latch 260 also is used as a carry-in value to carry-in adder 265. MD2, which equals the negative of ND2 (MD2=−(ND2))) is applied to an input of carry-in adder 265. In the event the MSB of the binary number output from latch 260 is (0), the value of MD2 is added to the current tap position currently being output by register 267. When the carry-in value of the MSB from latch 260 is a (1), .i.e., when the latch value is a negative number, the value input to adder 265 becomes MD2+1=MD1. Therefore, MD1=−(ND1). ND1 is the integer part of (Tdif/ Tdl). The current tap position value and either MD1 or MD2 are added to define the next tap position setting for the next clock index, which will be decoded by pre-decoder 215 and used to select a tap from MUX 210 from which a waveform having a frequency Fmx is output. Note that the values MD1 and MD2 are negative numbers. Adding a negative number to the current tap position selector ensures that the tap position will be decremented at the next cycle. Then, by choosing the output frequency Fmx from the MUX 210 to be slightly higher than the frequency (Fosc) of ring oscillator 203, the new tap position required will precess in a direction opposite to the wavefront in the ring oscillator 203 so that the state of the output of MUX 210 does not change when the taps are switched.

In an alternate embodiment in which a subtractor is substituted for adder 265, the values ND1 and ND2 are subtracted from the current tap position to select the next tap.

In various other embodiments, one or more frequency dividers or multipliers can be coupled to the output of MUX 210 to enable synthesis of a wide range of low-jitter output frequencies (Fout).

The present invention can be embodied in the form of computer-implemented processes and apparatuses for practicing those processes. The present invention also can be embodied in the form of computer program code embodied in tangible media, such as floppy diskettes, CD-ROMs, hard drives, or any other computer readable storage medium, wherein, when the computer program code is loaded into and executed by a computer, the computer becomes an apparatus for practicing the invention. The present invention can also be embodied in the form of computer program code, for example whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention.

When implemented on a general-purpose microprocessor, the computer program code segments configure the microprocessor to create specific logic circuits.

It should be understood that various changes in the details, materials and arrangements of the parts which have been described and illustrated in order to explain the nature of this invention may be made by those skilled in the art without departing from the principle and scope of the invention as expressed in the following claims. For example, although a sixteeen stage ring oscillator is described herein in reference to the invention, an oscillator with more or less stages and/or any number of taps may be substituted.

What I claim is:

1. A frequency synthesizer, comprising:

a fixed frequency oscillator providing a plurality of waveforms having a first frequency; and a waveform selector, the waveform selector operable to continuously select as an output waveform a waveform from the plurality of waveforms, the waveform selector comprising:

cumulative phase error memory for storing a current cumulative phase error, wherein the polarity of the stored cumulative phase error determines the waveform to be selected.

2. The frequency synthesizer of claim 1, wherein the selection of the waveform is made to provide an output waveform having low jitter with respect to an ideal waveform.

3. The frequency synthesizer of claim 1, further comprising a frequency lock to lock the frequency oscillator to its fixed frequency.

4. The frequency synthesizer of claim 3, wherein the frequency lock is a phase-locked loop.

5. The frequency synthesizer of claim 1, wherein the fixed frequency oscillator is a differential ring oscillator.

6. The frequency synthesizer of claim 1, wherein each waveform is delayed in time with respect to another of the waveforms.

7. The frequency synthesizer of claim 1, wherein the fixed frequency oscillator has a plurality of output taps and the waveform selector further comprises means for causing switching between the taps to provide the output waveform.

8. The frequency synthesizer of claim 7, wherein the waveform selector further comprises an adder for adding the value of a current tap selection with a value specifying a next tap selection.

9. The frequency synthesizer of claim 1, wherein the cumulative phase error is a sum of a series of incremental phase errors and the polarity of the current cumulative phase error determines which of a plurality of possible incremental phase errors are added to the current cumulative phase error to provide an updated cumulative phase error, the waveform selector further comprising:

(a) a switch for providing as an output one of the plurality of incremental phase errors; and (b) an adder for adding the switched incremental phase error with the current cumulative phase error.

10. A method of synthesizing a frequency, comprising:

(a) providing a plurality of waveforms having a first frequency;

(b) storing a current cumulative phase error having a polarity; and (c) using the polarity of the current cumulative phase error to continuously select as an output waveform a waveform from the plurality of waveforms.

11. The method of claim 10, wherein step (c) comprises the step of continuously selecting the waveform to provide an output waveform having low jitter with respect to ah ideal waveform.

12. The method of claim 10, wherein step (c) comprises the step of adding a value defining a currently selected waveform with a value specifying a next waveform.

13. The method of claim 10, further comprising the step of:

(d) adding an incremental phase error to the current cumulative phase error to provide an updated cumulative phase error.

14. The method of claim 13, wherein the incremental phase error to be added is selected from two possible incremental phase errors having opposite polarity, and the selection depends on the polarity of the current cumulative phase error.

15. A method for providing a synthesized waveform having low-jitter with respect to an ideal waveform, comprising the steps of:

(a) providing a plurality of waveforms having a first frequency, each waveform having a rising edge which is delayed in time with respect to a another of the waveforms;

(b) choosing from between two of the waveforms, the choice being constrained to the two waveforms which provide synthesized waveforms having instantaneous periods which bracket the period of the ideal waveform.

16. The method of claim 15, wherein the step (b) of choosing is based on a polarity of a cumulative phase error value.

* * * * *